United States Patent
Kang et al.

(10) Patent No.: US 8,797,737 B2
(45) Date of Patent: Aug. 5, 2014

(54) DISPLAY UNIT AND VENDING MACHINE HAVING THE SAME

(75) Inventors: Joon Kang, Seoul (KR); Sung Ki Kim, Seoul (KR); Hyun Yong Choi, Chuncheon-si (KR); Tae Sung Kim, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1397 days.

(21) Appl. No.: 12/430,384

(22) Filed: Apr. 27, 2009

(65) Prior Publication Data

US 2009/0277604 A1  Nov. 12, 2009

(30) Foreign Application Priority Data

May 7, 2008  (KR) .................. 10-2008-0042142

(51) Int. Cl.
*H05K 7/20* (2006.01)
(52) U.S. Cl.
USPC ....... 361/690; 361/694; 361/695; 361/679.48
(58) Field of Classification Search
None
See application file for complete search history.

(56) References Cited

U.S. PATENT DOCUMENTS

| | | | |
|---|---|---|---|
| 4,179,723 A | 12/1979 | Spencer | |
| 5,869,919 A | 2/1999 | Sato et al. | |
| 5,991,153 A * | 11/1999 | Heady et al. | 361/704 |
| 6,198,222 B1 * | 3/2001 | Chang | 313/582 |
| 6,493,440 B2 * | 12/2002 | Gromatzky et al. | 379/161 |
| 7,164,586 B2 * | 1/2007 | Lin | 361/714 |
| 7,190,578 B2 * | 3/2007 | Bang et al. | 361/694 |
| 7,269,009 B2 * | 9/2007 | Ryu et al. | 361/692 |
| 7,480,141 B2 * | 1/2009 | Takenoshita et al. | 361/695 |
| 7,580,258 B2 * | 8/2009 | Tseng et al. | 361/690 |
| 7,651,249 B2 * | 1/2010 | Ohashi et al. | 362/373 |
| 7,667,964 B2 * | 2/2010 | Kang et al. | 361/692 |
| 7,755,893 B2 * | 7/2010 | Yanagawa et al. | 361/695 |
| 7,760,491 B2 * | 7/2010 | Choi | 361/679.01 |

(Continued)

FOREIGN PATENT DOCUMENTS

| | | |
|---|---|---|
| CN | 1299121 | 6/2001 |
| CN | 1774163 | 5/2006 |

(Continued)

OTHER PUBLICATIONS

Korean Office Action dated Aug. 22, 2012 issued in KR Application No. 10-2008-0042142.

(Continued)

*Primary Examiner* — Boris Chervinsky
(74) *Attorney, Agent, or Firm* — Stanzione & Kim, LLP

(57) ABSTRACT

A display unit and a vending machine having the same. The display unit includes a display panel to display an image, a circuit board to control the display panel, a board bracket installed at a rear of the display panel and formed with a receiving section to receive the circuit board, and a plurality of inlet holes and a plurality of outlet holes formed in opposite surfaces of the board bracket to allow external air to flow through the receiving section. The air travels through the inlet and outlet holes and passes through the receiving section in one direction to cool the display panel and the circuit board. Thus, the display unit is prevented from malfunctioning and the display panel is prevented from being degraded by heat even if tempered glass is installed at a front of the display panel.

25 Claims, 4 Drawing Sheets

(56) References Cited

U.S. PATENT DOCUMENTS

| | | | | |
|---|---|---|---|---|
| 7,948,575 | B2* | 5/2011 | Oh et al. | 349/58 |
| 8,208,256 | B2* | 6/2012 | Ioki et al. | 361/695 |
| 8,254,121 | B2* | 8/2012 | Lee et al. | 361/695 |
| 8,264,659 | B2* | 9/2012 | Mikubo et al. | 349/161 |
| 8,284,328 | B2* | 10/2012 | Shinki et al. | 348/790 |
| 8,467,187 | B2* | 6/2013 | Itazawa et al. | 361/690 |

FOREIGN PATENT DOCUMENTS

| | | |
|---|---|---|
| EP | 1 253 459 A2 | 10/2002 |
| FR | 2 891 940 | 4/2007 |
| JP | 08-069254 | 3/1996 |
| JP | 11-175830 | 7/1999 |
| JP | 11-237844 | 8/1999 |
| JP | 2001-52242 | 2/2001 |
| JP | 2001-297623 | 10/2001 |
| JP | 2003-141616 | 5/2003 |
| JP | 2004-233791 | 8/2004 |
| JP | 2006-162641 | 6/2006 |
| JP | 2006-163217 | 6/2006 |
| JP | 2006-343374 | 12/2006 |
| KR | 1999-0034413 | 8/1999 |
| KR | 10-0422403 | 3/2004 |
| KR | 20060082212 | 7/2006 |
| KR | 20060087097 | 8/2006 |
| KR | 10-0638047 | 10/2006 |
| WO | 2006-080335 | 8/2006 |
| WO | 2007/116116 A1 | 10/2007 |
| WO | 2008/003038 A2 | 1/2008 |

OTHER PUBLICATIONS

Chinese Office Action dated Nov. 22, 2012 issued in CN Application No. 200980115197.0.

Chinese Office Action Issued on May 30, 2012 in CN Patent Application No. 200980115197.0.

"Announcement," Electronic Packaging and Production, Cahners Publishing Co., Newton, Massachusetts, US, vol. 33, No. 12, Dec. 1, 1993.

International Search Report mailed Dec. 14, 2009 in International Application No. PCT/KR2009/002286.

European Search Report mailed Jun. 22, 2011 in European Application No. 09742811.4.

Office Action issued in Japanese Application No. 2011-508416 on May 28, 2013.

* cited by examiner

DISPLAY UNIT AND VENDING MACHINE HAVING THE SAME

CROSS-REFERENCE TO RELATED APPLICATIONS

This application claims priority under 35 U.S.C. §119(a) of Korean Patent Application No. 10-2008-0042142 filed on May 7, 2008, in the Korean Intellectual Property Office, the disclosure of which is incorporated herein by reference.

BACKGROUND

1. Field of the Invention

The present general inventive concept relates to a vending machine. More particularly, the present general inventive concept relates to a vending machine provided with a display panel for displaying various information on a front surface thereof.

2. Description of the Related Art

In general, a display unit includes a display panel for displaying various images. Recently, such a display unit is used in a vending machine to display various information such as information about products contained in the vending machine, as well as various advertisements.

The display unit includes a display panel for displaying images on a front surface thereof and a circuit board having circuits for controlling functions of the display panel.

When the display panel is used in a vending machine, the display panel may be easily broken if external impact is applied to the display panel, so tempered glass having high strength is installed on a front surface of the display panel.

However, since heat is generated from the display panel and the circuit board while the display unit is being operated, if the tempered glass is installed on the front surface of the display panel, the heat generated from the display panel and the circuit board may not be emitted to the outside thereof due to the tempered glass having insulation effect, so that the display unit may malfunction or the display panel may be degraded due to the heat, thereby shortening the life span of the display unit.

SUMMARY

Accordingly, embodiments of the present general inventive concept provide a display unit capable of effectively emitting heat generated from a display panel and a circuit board and a vending machine having the same.

Additional features and utilities of the present general inventive concept will be set forth in part in the description which follows and, in part, will be obvious from the description, or may be learned by practice of the present general inventive concept.

Embodiments of the present general inventive concept are achieved by providing a display unit including a display panel to display an image, a circuit board to control the display panel, a board bracket installed at a rear of the display panel and formed with a receiving section to receive the circuit board, and a plurality of inlet holes and outlet holes formed in opposite surfaces of the board bracket to allow external air to flow through the receiving section.

A plurality of blowing fans may be installed in the inlet and outlet holes to guide the external air into and out of the receiving section, respectively.

The inlet holes and outlet holes may be formed in the opposite surfaces of the board bracket in a row, respectively.

The blowing fans may include axial-flow fans and shafts of the axial-flow fans may be arranged in parallel to a surface of the circuit board.

The circuit board may include a power board installed at an upstream side of the air to convert input power into operating power for the display unit, and a main board installed at a downstream side of the air to control operation of the display panel.

The circuit board may be spaced apart from a rear surface of the display panel to allow the air to flow between the circuit board and the display panel.

The display panel may include a liquid crystal panel.

The display unit may include tempered glass installed at a front of the display panel to prevent the display panel from being broken.

The display unit may also include a cover that covers an open rear side of the board bracket.

Perforation holes may be formed in a front surface of the board bracket adjacent to a rear surface of the display panel.

Embodiments of the present general inventive concept provide a vending machine including a housing and a display unit installed in the housing to display an image, wherein the display unit includes a display panel to display the image, a circuit board to control the display panel, a board bracket installed at a rear of the display panel and formed with a receiving section to receive the circuit board, and a plurality of inlet holes and a plurality of outlet holes formed in opposite surfaces of the board bracket to allow external air to flow through the receiving section.

A plurality of blowing fans may be installed in the inlet and outlet holes to guide the external air into and out of the receiving section, respectively.

The housing may be formed with a suction port for sucking air from the outside and a discharge port for discharging the air after the air has passed through the display unit.

The inlet holes may be formed in a lower surface of the board bracket and the outlet holes may be formed in an upper surface of the board bracket. The suction port may be formed at a lower portion of the housing, and the discharge port can be formed at an upper portion of the housing, so that the air flows upward in the housing while passing through the display unit.

The suction port may be formed in at least one of a lower surface and a side surface of the housing, and the discharge port may be formed at an upper surface of the housing.

As described above, according to the display unit and the vending machine having the same present general inventive concept, the inlet and outlet holes may be formed in the board bracket, so that air may travel through the inlet and outlet holes and pass through the receiving section of the board bracket while absorbing heat generated from the display panel and the circuit board, and then may be exhausted out of the board bracket by the blowing fan. Thus, the display panel and the circuit board may be cooled by the air, so that the display unit can be prevented from malfunctioning and the display panel can be prevented from being degraded due to the heat even if the tempered glass is installed at the front surface of the display panel.

Embodiments of the present general inventive concept also provide a method of discharging heat from a display unit usable with a vending machine, the method including installing a board bracket on a display panel, the board bracket having a receiving section; a circuit board installed on the board bracket through the receiving section; and a plurality of inlet holes and outlet holes formed in opposite surfaces of the board bracket to allow air to flow within the frame.

Embodiments of the present general inventive concept also provide a display unit usable with a vending machine, including a display panel to display an image thereon, and a board bracket installed on the display panel having a circuit board installed thereon to control the display panel, and having an air passage between the surfaces of the board bracket and the circuit board.

Embodiments of the present general inventive concept also provide a system to provide gaming entertainment, including a frame; a screen unit attached to an external surface of the frame to display gaming components and results; a depot to house prizes within the frame; an electronic board to control the screen unit as well as disposal of prizes; coin and bill insertion holes to receive payment to play the system; a prize discharge port to allow retrieval of any prizes; and a plurality of inlet and outlet ducts on opposing surfaces along the frame to allow external air to flow within the frame.

BRIEF DESCRIPTION OF THE DRAWINGS

These and/or other features and advantages of the present general inventive concept will become apparent and more readily appreciated from the following description of the embodiments, taken in conjunction with the accompanying drawings of which.

DETAILED DESCRIPTION OF THE EMBODIMENTS

Figure 1:
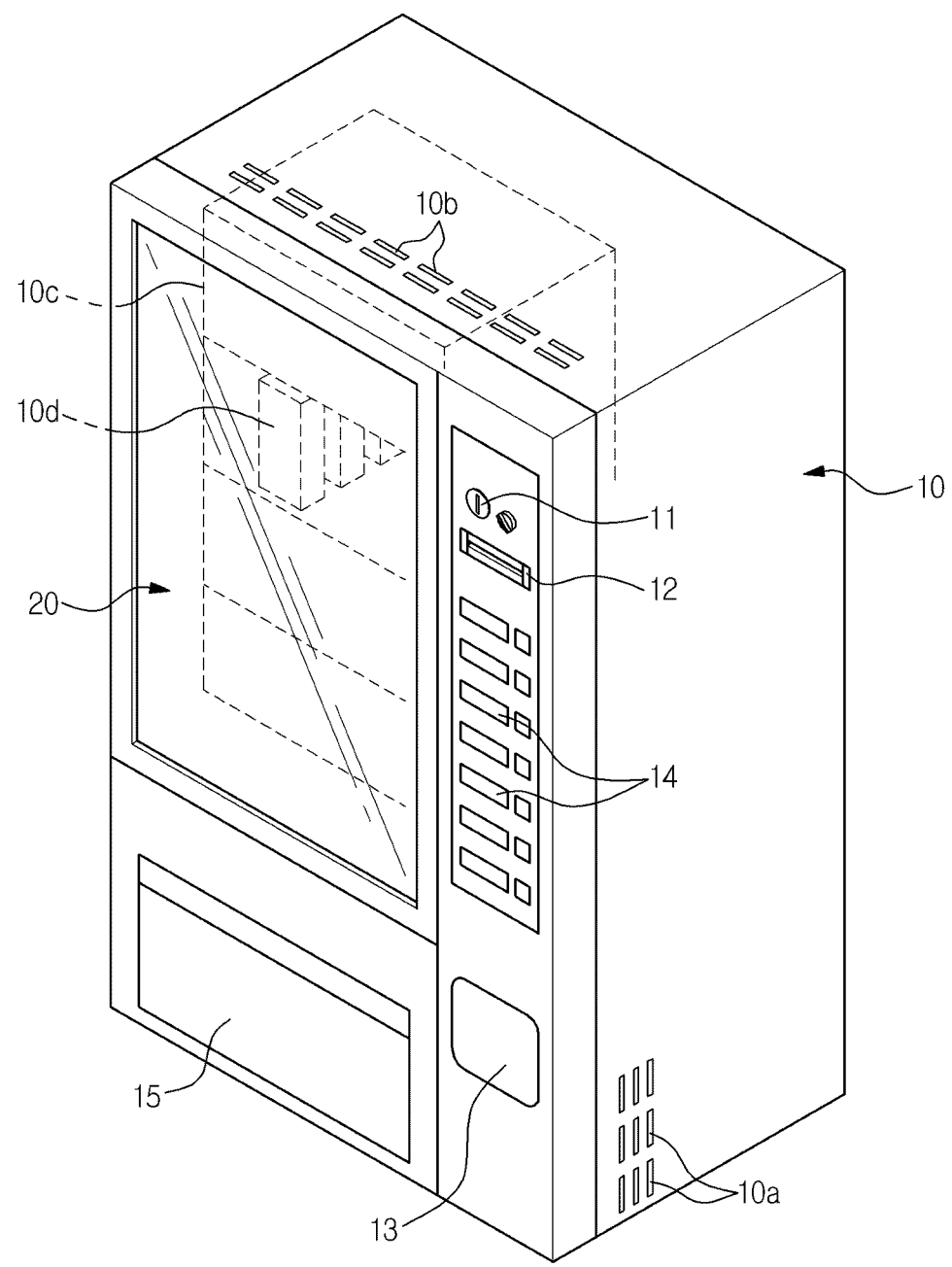
FIG. 1 is a perspective view illustrating a vending machine according to an exemplary embodiment of the present general inventive concept.

Reference will now be made in detail to the embodiments of the present general inventive concept, examples of which are illustrated in the accompanying drawings, wherein like reference numerals refer to the like elements. The embodiments are described below to explain the present general inventive concept by referring to the figures.

As illustrated in FIG. 1, a vending machine according to the present general inventive concept includes a housing 10 and a display unit 20 installed at a front upper portion of the housing 10 to display information about products or various advertisements.

The housing 10 may be formed on one side of the display unit 20 with a coin insertion hole 11 to input coins, a bill insertion hole 12 to input bills, a coin discharge port 13 to discharge the change, and a plurality of buttons 14 to allow a user to select products. The display unit may be used for consumable products, such as snack foods and beverages, or as a system to provide gaming entertainment, such as for slot or pachinko machines. The display unit may serve as a screen unit to display images produced by an electronic board relevant to the gaming entertainment. The housing may contain a depot 10c to house prizes 10d, such as monetary winnings, as illustrated in FIG. 1. Also, the coin and bill insertion holes may constitute insertion holes to receive payment to play the system.

A product discharge port 15 may be formed below the display unit 20 to discharge the product selected by the user. The product may be stored in a portion of the housing connected to the product discharge port 15. The vending machine may further include a controller to control the above described elements to receive a bill and a coin, to recognize a selection of the button 14 and to control the product to be discharged to a user. Since the above-described elements are well-known, detailed descriptions thereof will be omitted.

Figure 2:
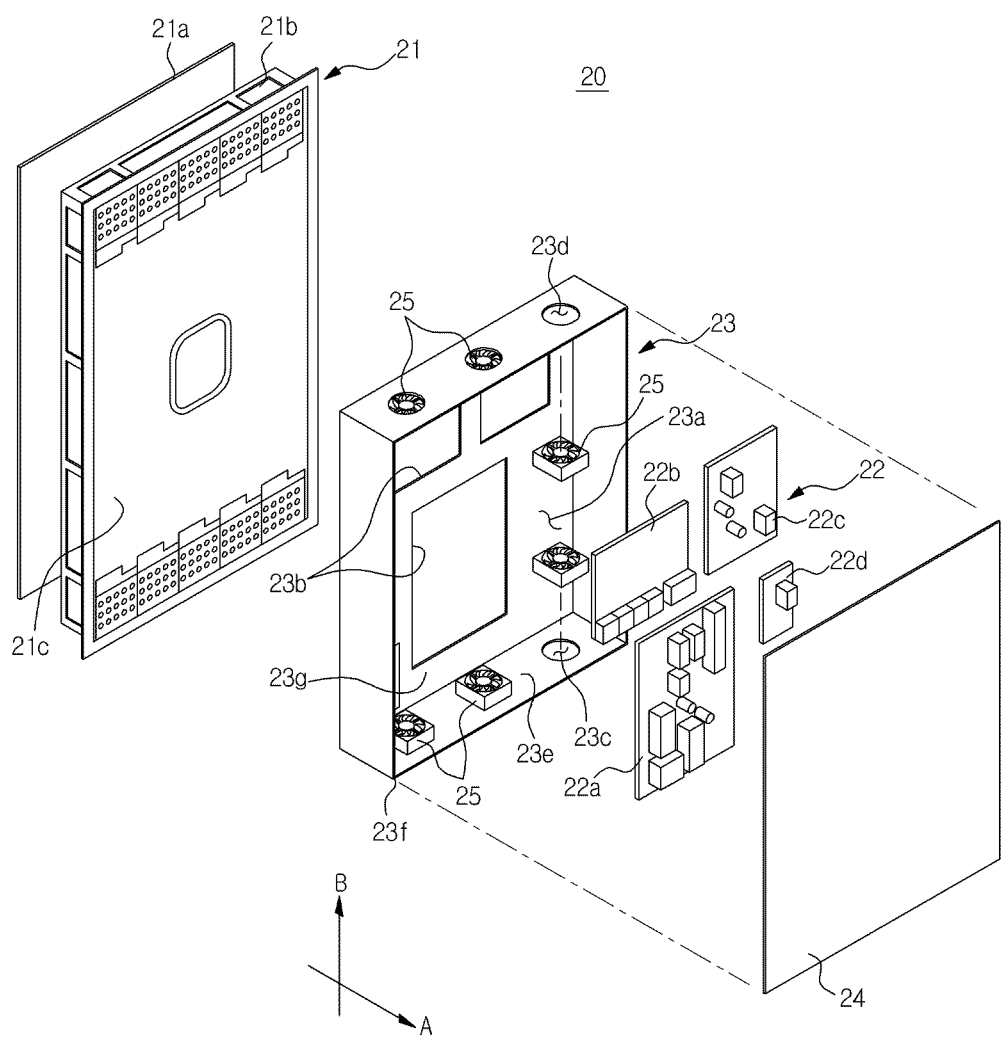
FIG. 2 is a perspective view illustrating a display unit usable with a vending machine according to an exemplary embodiment of the present general inventive concept

As illustrated in FIG. 2, the display unit 20 may include a display panel 21 to display images on a front surface thereof, a circuit board 22 to control the display panel 21, and a board bracket 23 installed at a rear surface 21c of the display panel 21 and formed with a receiving section 23a to receive the circuit board 22 therein.

A flat display panel 21 may include, for example, a liquid crystal panel 21b and tempered glass 21a having high strength can be installed at a front surface 21a of the display panel 21 to prevent the display panel 21 from being damaged by external impact applied thereto.

The circuit board 22 includes a power board 22a to convert external input power into operating power for the display unit 20, a main board 22b to control the operation of the display unit 20, a network board 22c to realize the network function by communicating with an external device to receive a control signal to control elements of the vending machine or the display unit 20, and a sub-power board 22d to supply power to the network board 22c.

The board bracket 23 has a box shape with an open rear portion. The board bracket 23 may be fixed to a rear surface 21c of the display panel 21 and a plurality of perforation holes 23b may be formed in the board bracket 23 to allow heat generated from the display panel 21 to be easily transferred to the receiving section 23a of the board bracket. In addition, a cover 24 may be coupled to an edge portion 23f to cover the open rear portion 23e of the board bracket 23 to protect the circuit board 22 by covering the receiving section 23a of the board bracket 23.

The circuit board 22 may include a controller to control the display panel 21 as well as the products with the display to be released via the product discharge port 15.

The display panel 21 and the circuit board 22 are connected through one or more communication lines (not illustrated) through perforation holes 23b in the board bracket.

The display unit 20 can be used in or with a vending machine according to the present general inventive concept and can include a plurality of inlet holes 23c formed in one of opposite surfaces of the board bracket 23 to allow external air to flow into the receiving section 23a, a plurality of outlet holes 23d formed in the other of the opposite surfaces of the board bracket 23 to allow the air in the receiving section 23a to be discharged to the outside, and blowing fans 25 installed in the inlet and outlet holes 23c and 23d to guide the air into the receiving section 23a via the inlet holes 23c in order to cool the display unit 20 and discharging heat generated from the display panel 21 and the circuit board 22 via the outlet holes 23d and out of the display unit 20.

The blowing fans 25 installed in the inlet holes 23c guide external air into the receiving section 23a of the board bracket 23 in a direction B, and the blowing fans 25 installed in the outlet holes 23d discharge the air to the outside through the receiving section 23a of the board bracket 23, so that the air blown by the blowing fans 25 passes through the receiving section 23a of the board bracket 23 in one direction B. In the vending machine, the air is allowed to flow in the upward direction in the housing 10, so that the inlet holes 23c are formed in the lower surface of the board bracket 23 and the outlet holes 23d are formed in the upper surface of the board bracket 23. In this case, the air passes through the receiving section 23a of the board bracket 23 in the upward direction, thereby cooling the display unit 20.

The cover 24 may be fixed to the display panel 21 by a distance of Tb or by the thickness of the board bracket 23 in a direction A. The power board 22a and main board 22b may be fixed to an internal surface 23g of the board bracket 23 by connectors 22e at a distance of Ta and Tc, respectively. Further, although the difference in distance between Ta and Tc may vary, the distance Tb generally remains greater than either Ta or Tc when the display unit is fully assembled.

Figure 3:
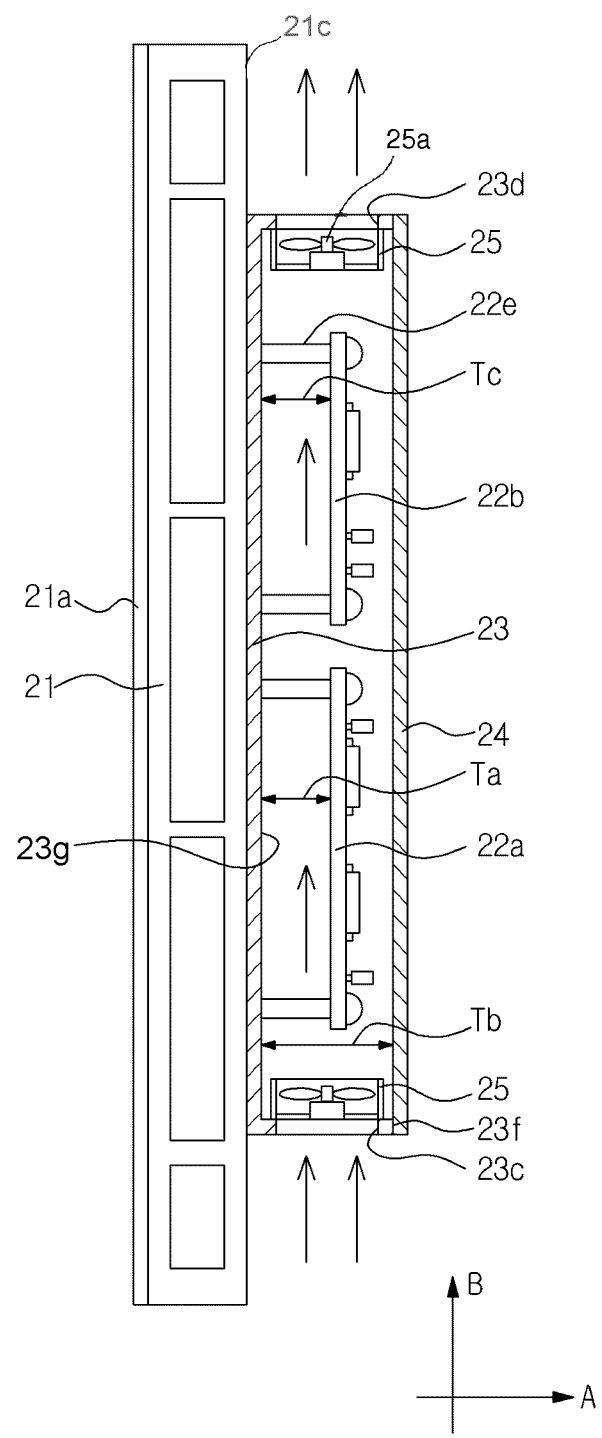
FIG. 3 is a side sectional view illustrating a display unit usable with a vending machine according to an exemplary embodiment of the present general inventive concept.

According to an exemplary embodiment, the blowing fan 25 includes an axial-flow fan to blow air in the axial direction, that is, in direction B. As illustrated in FIG. 3, a shaft 25a of the blowing fan 25 is disposed in parallel to a surface of the circuit board 22 and the display panel 21, so that air may flow in parallel to the circuit board 22 and the display panel 21. The circuit board 22 may be spaced apart from the rear surface of the display panel 21 by a predetermined distance. Thus, the air, which is blown by the blowing fan 25 in the axial direction of the blowing fan 25, can travel in parallel to the circuit board 22 and the display panel 21 through a space between the circuit board 22 and the display panel 21 and passes through the receiving section 23a of the board bracket 23. Thus, the heat generated from the circuit board 22 and the display panel 21 may be emitted out of the display unit 20, so that the circuit board 22 and the display panel 21 may be cooled.

Referring again to FIG. 2, a plurality of inlet holes 23c can be formed in a lower surface of the opposite surfaces of the board bracket 23 in a row, a plurality of outlet holes 23d may be formed in an upper surface of the opposite surfaces of the board bracket 23 in a row, and a plurality of blowing fans are installed in the inlet and outlet holes 23c and 23d, respectively, in such a manner that the air can uniformly cool the internal portion of the receiving section 23a of the board bracket 23. According to an exemplary embodiment, three inlet holes 23c are formed in the lower surface of the board bracket 23, three outlet holes 23d are formed in the upper surface thereof, and blowing fans 25 are installed in the three inlet holes 23c and the three outlet holes 23d, respectively, so that six blowing fans 25 are installed on the board bracket 23.

Furthermore, the air can flow within the display unit in between the internal surface 23g of the board bracket 23 and the cover 24. More specifically, the air can flow between the internal surface 23g and the power board 22a as well as between the internal surface 23g and the main board 22b. Also, air can flow between the power board 22a and the cover 24 as well as between the main board 22b and the cover 24. However, the air generally travels upwardly, from one or more inlet holes 23c towards one or more outlet holes 23d.

In addition, the power board 22a and the main board 22b of the circuit board 22 play the main role in operation of the display unit 20. The power board 22a and the main board 22b must be cooled to stably operate the display unit 20. In particular, the power board 22a may generate a greater amount of heat than the main board 22b, so it is more important to cool the power board 22a. In order to efficiently cool the power board 22a, the power board 22a may be installed at an upstream side of the air that flows through the receiving section 23a of the board bracket 23 by the blowing fan 25, and the main board 22b may be installed at a downstream side of the airflow in the display unit 20 used for the vending machine according to the present general inventive concept. According to an exemplary embodiment, the inlet and outlet holes 23c and 23d are formed in the lower and upper surfaces of the board bracket 23 to cool the circuit board 22 and the display panel 21 by blowing the air in the upward direction through the board bracket 23, thus the power board 22a may be installed below the receiving section 23a of the board bracket 23 to correspond to the upstream side of the air and the main board 22b may be installed above the receiving section 23a of the board bracket 23 to correspond to the downstream side of the air.

In addition, as illustrated in FIG. 1, the housing 10 of the vending machine according to the present general inventive concept invention can be formed with a suction port 10a for sucking external air into the display unit 20, and a discharge port 10b for discharging air out of the housing 10 after the air cools the display unit 20. As mentioned above, since the air passes through the display unit 20 while flowing from the bottom to the top of the housing 10 in the vending machine, the suction port 10a may be provided at the lower portion of the housing 10 and the discharge port 10b may be provided at the upper portion of the housing 10 such that the display unit 20 can be effectively cooled by the air flowing from the bottom to the top of the housing 10. The suction port 10a may be provided in at least one of a lower surface (not shown) and a side surface of the housing 10, and the discharge port 10b may be formed on an upper surface of the housing 10. In addition, although not shown in the drawings, a dust filter can be installed in the suction port 10a in order to filter impurities, such as dust, contained in the external air introduced into the suction port 10a.

Figure 4:
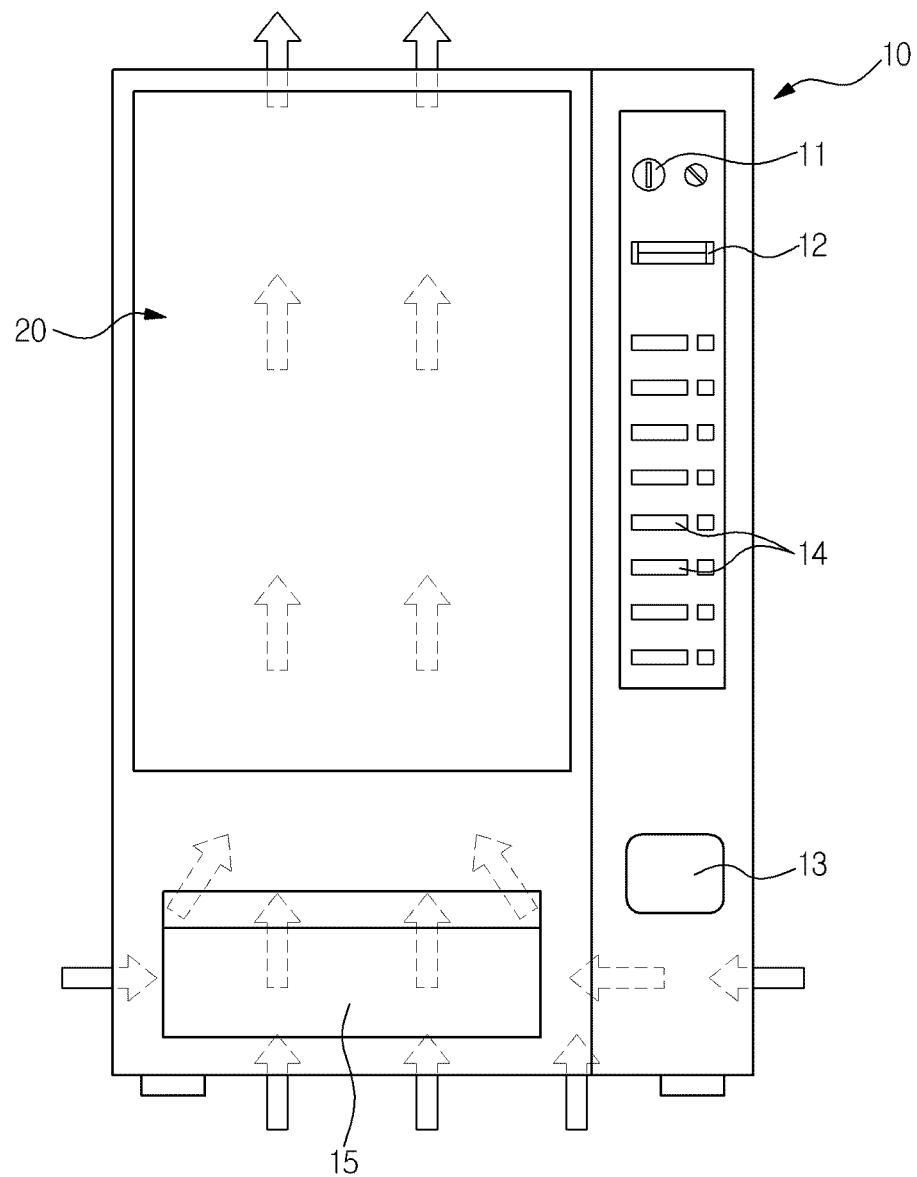
FIG. 4 is a schematic view illustrating an air path in a vending machine according to an exemplary embodiment of the present general inventive concept

Thus, as illustrated in FIG. 4, the air may be introduced into the housing 10 through the suction ports 10a formed at the lower surface and the side surface of the housing and then pass through the display unit 20 while absorbing heat generated from the display panel 21 of the display unit 20 and the circuit board 22. Thereafter, the air is discharged to the outside through the discharge port 10b, so that the display panel 21 and the circuit board 22 can be cooled by the air, which may travel through the inlet holes 23c and the outlet holes 23d, even if the tempered glass 21a is installed at the front of the display panel 21, thereby preventing malfunction of the display unit 20 and degradation of the display panel 21.

Although few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. A display unit comprising:
   a display panel to display an image;
   a circuit board to control the display panel;
   a board bracket installed at a rear of the display panel and formed with a receiving section to receive the circuit board; and
   a plurality of inlet holes and outlet holes formed in opposite surfaces of the board bracket to allow external air to flow through the receiving section,
   wherein perforation holes are formed in a front surface of the board bracket adjacent to a rear surface of the display panel to allow heat generated from the display panel to be transferred to the receiving section of the board bracket.

2. The display unit of claim 1, further comprising a plurality of blowing fans installed in the inlet and outlet holes to guide external air into the receiving section.

3. The display unit of claim 1, wherein the opposite surfaces of the board bracket are provided with the inlet holes and the outlet holes in a row, respectively.

4. The display unit of claim 2, wherein the blowing fans include axial-flow fans and shafts of the axial-flow fans are arranged in parallel to a surface of the circuit board.

5. The display unit of claim 1, wherein the circuit board includes a power board installed at an upstream side of the air to convert input power into operating power for the display unit, and a main board installed at a downstream side of the air to control operation of the display unit.

6. The display unit of claim 1, wherein the circuit board is spaced apart from a rear surface of the display panel to allow the air to flow between the circuit board and the display panel.

7. The display unit of claim 1, wherein the display panel includes a liquid crystal panel.

8. The display unit of claim 1, further comprising tempered glass installed at a front of the display panel to prevent the display panel from being broken.

9. The display unit of claim 1, further comprising a cover that covers an open rear side of the board bracket.

10. A vending machine comprising:
    a housing;
    a display unit installed in the housing to display an image, wherein the display unit comprises:
    a display panel for displaying the image;
    a circuit board for controlling the display panel;
    a board bracket installed at a rear of the display panel and formed with a receiving section to receive the circuit board; and
    a plurality of inlet holes and outlet holes formed in opposite surfaces of the board bracket to allow external air to flow through the receiving section,
    wherein perforation holes are formed in a front surface of the board bracket adjacent to a rear surface of the display panel to allow heat generated from the display panel to be transferred to the receiving section of the board bracket.

11. The vending machine of claim 10, further comprising a plurality of blowing fans installed in the inlet and outlet holes to guide external air into and out of the receiving section, respectively.

12. The vending machine of claim 11, wherein the opposite surfaces of the board bracket are provided with the inlet holes and the outlet holes arranged in a row, respectively.

13. The vending machine of claim 11, wherein the blowing fans include axial-flow fans and shafts of the axial-flow fans are arranged in parallel to a surface of the circuit board.

14. The vending machine of claim 10, wherein the circuit board includes a power board installed at an upstream side of the air to convert input power into operating power for the display unit, and a main board installed at a downstream side of the air to control operation of the display unit.

15. The vending machine of claim 10, wherein the circuit board is spaced apart from a rear surface of the display panel to allow the air to flow between the circuit board and the display panel.

16. The vending machine of claim 10, wherein the display panel includes a liquid crystal panel.

17. The vending machine of claim 10, further comprising tempered glass installed at a front of the display panel to prevent the display panel from being broken.

18. The vending machine of claim 10, further comprising a cover that covers an open rear side of the board bracket.

19. The vending machine of claim 10, wherein the housing formed with a suction port for sucking air from an outside and a discharge port for discharging the air after the air has passed through the display unit.

20. The vending machine of claim 19, wherein the inlet holes formed in a lower surface of the board bracket, the outlet holes are formed in an upper surface of the board bracket, and the suction port is formed at a lower portion of the housing, and the discharge port is formed at an upper portion of the housing, so that the air is guided to flow upward in the housing while passing through the display unit.

21. The vending machine of claim 20, wherein the suction port is formed in at least one of a lower surface and a side surface of the housing, and the discharge port is formed at an upper surface of the housing.

22. A method of discharging heat from a display unit usable with a vending machine, the method comprising:
    installing a board bracket on a display panel, the board bracket having a receiving section, a circuit board installed on the board bracket through the receiving section, and a plurality of inlet holes and outlet holes formed in opposite surfaces of the board bracket to allow air to flow within the display unit,
    wherein perforation holes are formed in a front surface of the board bracket adjacent to a rear surface of the display panel to allow heat generated from the display panel to be transferred to the receiving section of the board bracket.

23. A display unit usable with a vending machine, comprising:
    a display panel to display an image thereon, and
    a board bracket installed on the display panel having a circuit board installed thereon to control the display panel, and having an air passage between surfaces of the board bracket and surfaces of the circuit board,
    wherein perforation holes are formed in a front surface of the board bracket adjacent to a rear surface of the display panel to allow heat generated from the display panel to be transferred to a receiving section of the board bracket.

24. The display unit of claim 23, wherein the board bracket comprises:
    a first surface attached to the display panel and a second surface spaced apart from the first surface by a distance to form the air passage with the first surface, and
    the circuit board is disposed in the air passage.

25. The display unit of claim 23, wherein the board bracket comprises:
    opposite surfaces having holes to form an inlet and an outlet of the air passage.

* * * * *